United States Patent [19]

Auvert et al.

[11] Patent Number: 4,964,940

[45] Date of Patent: Oct. 23, 1990

[54] LASER MICROBEAM MACHINE FOR ACTING ON THIN FILM OBJECTS, IN PARTICULAR FOR CHEMICALLY ETCHING OR DEPOSITING SUBSTANCE IN THE PRESENCE OF A REACTIVE GAS

[75] Inventors: Geoffroy Auvert, Grenoble; Jean-Claude Georgel, Lambesc; Yves Guerin, Pourrieres, all of France

[73] Assignee: Etat Fracais, France

[21] Appl. No.: 440,789

[22] Filed: Nov. 24, 1989

[30] Foreign Application Priority Data

Nov. 25, 1988 [FR] France .................. 88 15435

[51] Int. Cl.⁵ .......................... B44C 1/22; C23F 1/02; C23C 14/00; B23K 9/00
[52] U.S. Cl. .................. 156/345; 118/50.1; 118/729; 156/643; 156/646; 219/121.68; 427/53.1
[58] Field of Search ............... 156/345, 643, 646, 656, 156/657, 665; 427/53.1, 54.1; 118/715, 729, 50.1, 620; 219/121.6, 121.61, 121.68, 121.69, 121.82, 121.83, 121.84, 121.85

[56] References Cited

U.S. PATENT DOCUMENTS

| 3,626,046 | 12/1971 | Krause et al. .................. 264/81 |
| 4,340,617 | 7/1982 | Deutsch et al. .................. 427/53.1 |
| 4,801,352 | 1/1989 | Piwczyk .......................... 156/646 X |
| 4,873,413 | 10/1989 | Uesugi et al. .................. 427/53.1 X |
| 4,901,668 | 2/1990 | Murakami .......................... 118/722 |

FOREIGN PATENT DOCUMENTS 2608484 6/1988 France .
59-126744 7/1984 Japan .

Primary Examiner—William A. Powell
Attorney, Agent, or Firm—Bell, Seltzer, Park & Gibson

[57] ABSTRACT

The machine of the invention comprises a sealed enclosure (10) in which a microscope objective lens (34) is fixed and receives a laser beam (36) via a thick transparent window (38), the enclosure also containing a reaction chamber (20) constituted by a sealed box having a lid which constitutes a thin transparent window (56) beneath which the thin film object (32) to be treated is placed. Means (72, 80, 74) serve to evacuate the enclosure (10) and the reaction chamber (20) and to convey reactive gas into the reaction chamber. The invention is particularly applicable to treating electronic circuits, hybrid circuits, etc.

11 Claims, 2 Drawing Sheets

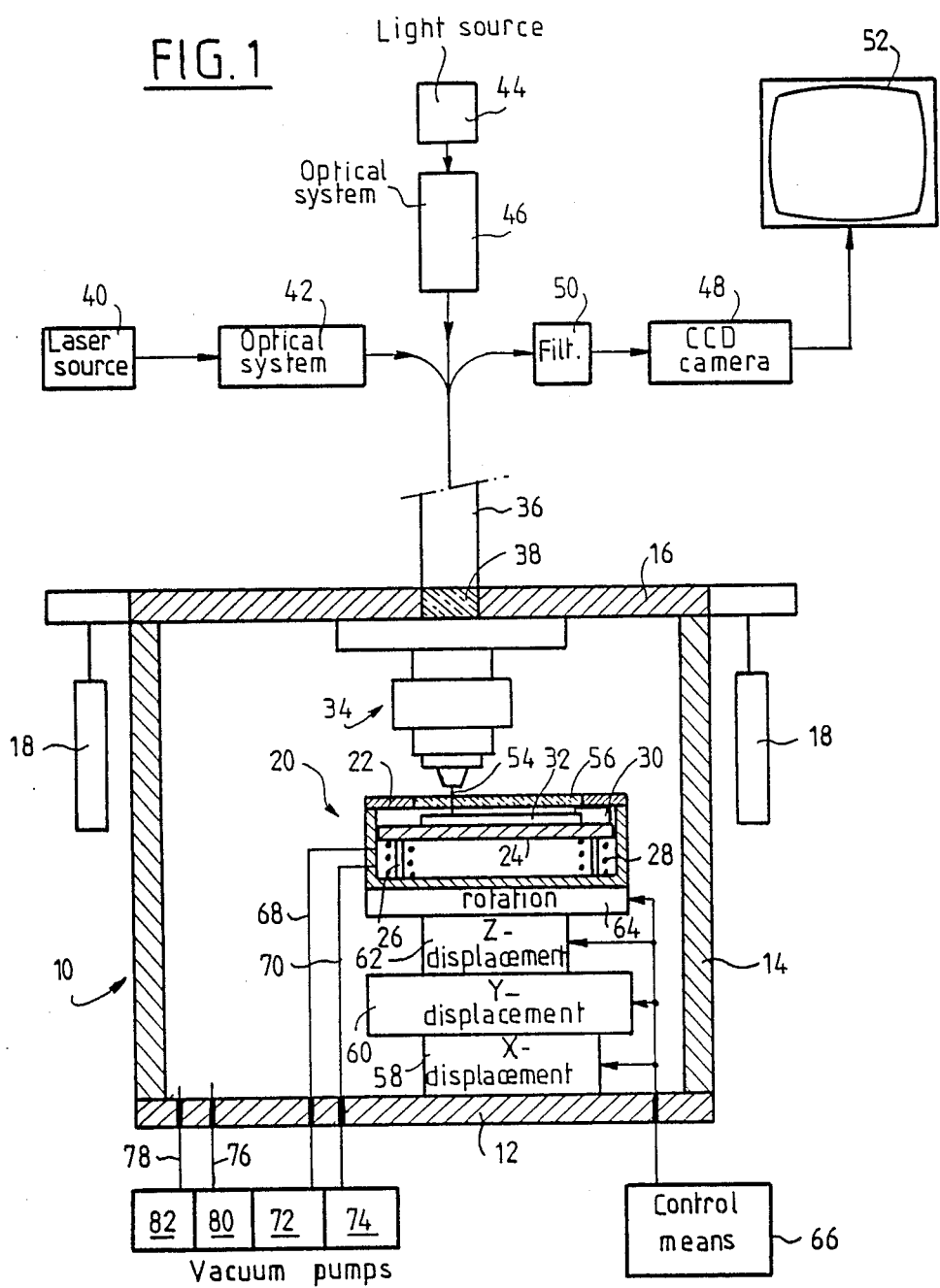

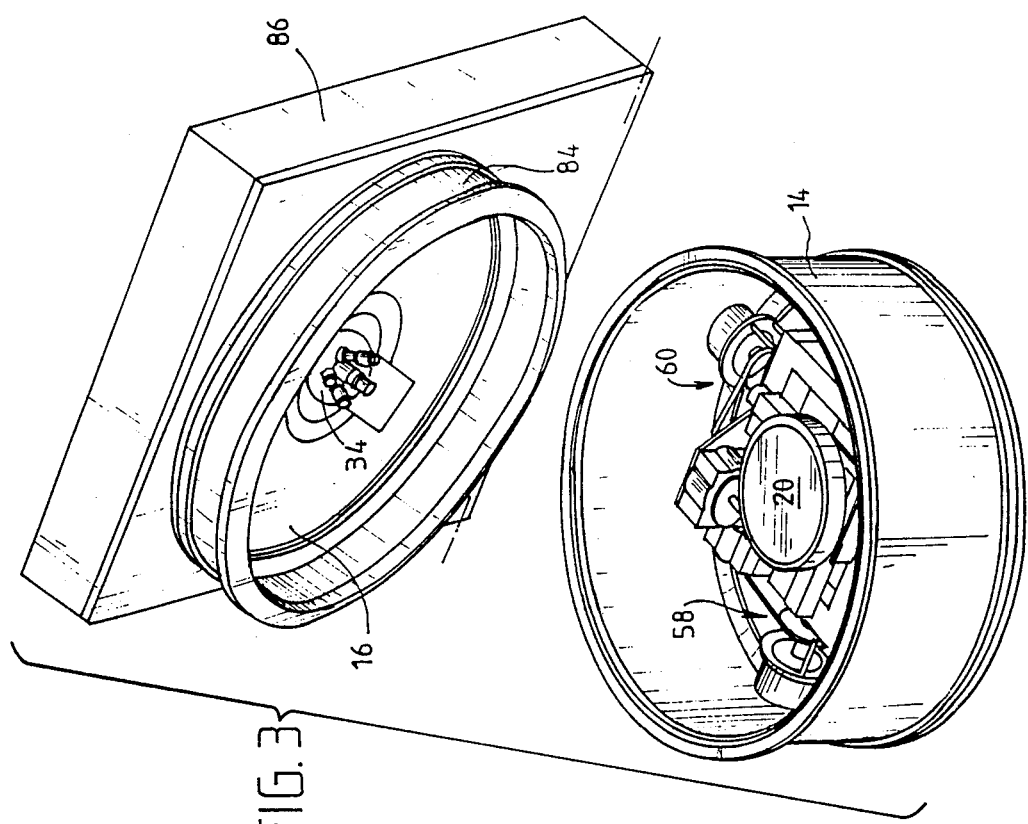
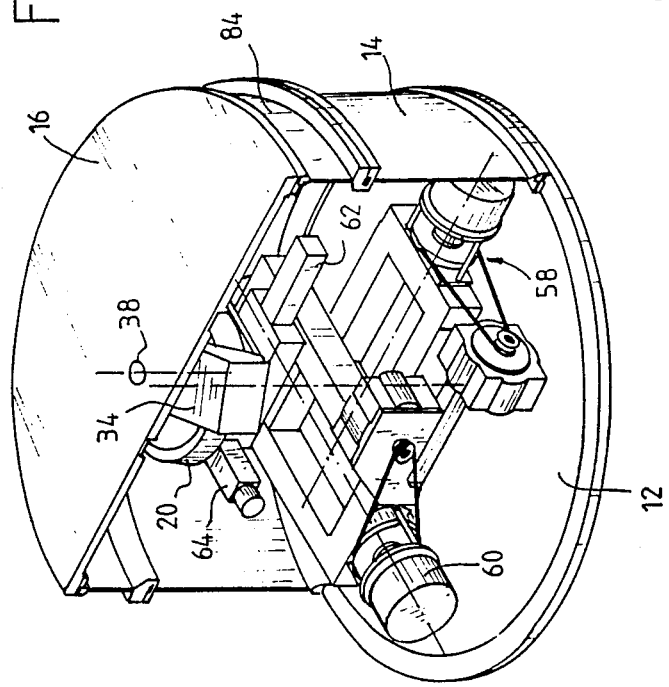

LASER MICROBEAM MACHINE FOR ACTING ON THIN FILM OBJECTS, IN PARTICULAR FOR CHEMICALLY ETCHING OR DEPOSITING SUBSTANCE IN THE PRESENCE OF A REACTIVE GAS

The invention relates to a laser microbeam machine for acting on thin film objects, such as electronic circuits, flat screens, and magnetic read heads, in particular for chemically etching and depositing substance on the surface of such objects in the presence of a reactive gas.

BACKGROUND OF THE INVENTION

The applicants' French patent No. 2 608 484 describes a laser microbeam machine for performing, in particular, very fine and very accurate cutting operations of thin films of material, for correcting microdefects in electronic circuits, for repairing them, for reconfiguring them, for performing microanalysis thereof, etc. This machine essentially comprises: a laser source such as a continuous argon laser; an optical system for transmitting the laser beam emitted by the source to the objective lens of a microscope pointing towards the object to be treated; and means for supporting the displacing said object along three perpendicular axes. This machine also has the advantage of enabling the work of the laser microbeam on the object to be treated to be observed continuously on a video screen.

such a machine could also be used for chemically etching or depositing material on a thin film of material, by applying the principle described in U.S. Pat. No. 4,340,617. According to this principle, a laser beam is applied to a thin film of material lying in a suitable reactive gas, preferably at low pressure. The heat given off at the point of impact of the laser beam, and the flux of photons give rise respectively to a chemical reaction between the material of the thin film and the reactive gas, and to a chemical reaction within the gas, thereby giving rise to etching and deposition of material localized at the point of impact of the laser beam.

Since the thin film object must be placed in a reactive gas at low pressure, it may be placed in a sealed reaction chamber or box of small volume having one face containing a window which is transparent to the laser radiation, with the box then being closed, a vacuum being established therein, and then the reactive gas being inserted therein at the desired pressure. In practice, the laser-passing window must be relatively large in area so as to make it possible to act over all of the surface of an electronic circuit, or nearly all of its surface, and the thickness of the window must be sufficient to withstand pressure variations of about 1 atmosphere ($10^5$ Pa).

This relatively large thickness of transparent material gives rise to two major drawbacks:

it fixes a minimum distance between the surface of the object to be treated and the tip of the microscope objective lens used for focusing the laser beam; and it degrades the optical qualities of a very small diameter laser beam very considerably.

Such a reaction chamber can therefore only be used with a microscope lens having relatively low magnification power and the diameter of the laser beam cannot be reduced to values of about 1 micron which would otherwise enable very fine and very accurate work to be performed.

In order to avoid this drawback, a machine has been proposed in which the thin film object is not enclosed in a sealed box, but is merely placed on a support beneath the microscope lens and surrounded by concentric zones, the first of which is connected to a supply of reactive gas while the subsequent zones are connected to sources of suction. In this way, the laser beam passing through the microscope lens arrives directly on the thin film of the object without going through a window, and the object is in a localized environment of reactive gas which is dynamically isolated from the surrounding atmosphere by the concentric annular suction zones.

However, this known prior technique does not enable the pressure and the composition of the reactive gas over the working zone to be properly mastered, nor does it make it possible to work at low pressure which is essential for good quality etching or deposition of substance on the thin film of the object.

In addition, since the reactive gas is generally toxic or explosive, the safety of personnel operating on the machine becomes a problem.

An object of the invention is to provide a simple and effective solution to these various problems.

Another object of the invention is a machine for chemically etching and depositing material on a thin film object by means of a very fine laser microbeam, having a diameter of less than a micron, for example.

Another object of the invention is a machine of this type in which it is possible to control the pressure and the composition of the reactive atmosphere very accurately, and in which it is possible to operate at low pressure.

Another object of the invention is a machine of this type which is usable in an industrial environment.

SUMMARY OF THE INVENTION

To this end, the invention provides a machine comprising a laser source, a microscope objective lens pointing towards the object to be treated, and optical means for transmitting the laser beam from the source to the microscope lens, the machine comprising:

a reaction chamber formed essentially by a sealed box closed by a thin transparent lid and intended to receive the thin film objects and the reactive gas;

a sealed enclosure in which the reaction chamber and the microscope lens are housed, with the lens being carried by one of the walls of said enclosure;

suction means for reducing pressure simultaneously both in the reaction chamber and in the enclosure; and means for inserting a reactive gas at low pressure into the reaction chamber.

The pressure inside the enclosure and inside the reaction chamber may be substantially equal and vary simultaneously such that the transparent lid of the reaction chamber does not have to withstand major variations in pressure and can therefore be very thin. This makes it possible to use a laser microbeam which is very small in diameter, e.g. less than 1 $\mu$m.

Advantageously, when the thin film object is constituted by a transparent plate having only one face including a thin film, as is the case, for example, of liquid crystal flat screens and of photolithographic masks, the object itself may act as the transparent lid of the reaction chamber. In this case, the object replaces the lid of the reaction chamber so as to close the reaction chamber in sealed manner, with its face carrying the thin film facing towards the inside of the reaction chamber in order to be capable of making contact with the reactive atmosphere. The laser beam passes through the transparent plate of the object and acts on the thin film for etching, deposition, or cutting purposes.

The machine may include means for regulating the pressure inside the enclosure to a value which is substantially equal to or slightly greater than the pressure of the reactive gas inside the reaction chamber, said means operating by inserting an inert gas such as nitrogen into the enclosure.

These means make it possible to avoid too large a pressure difference being set up between the reaction chamber and the enclosure when a reactive gas is inserted into the reaction chamber, and to maintain a slightly higher pressure outside the reaction chamber in order to avoid leaks of reactive gas which, to a greater or lesser extent, could be toxic, explosive, or corrosive relative to various materials.

The wall of the enclosure on which the microscope lens is fixed may include a window which is transparent to the laser radiation in order to transmit said radiation to the microscope lens, the window being of sufficient thickness to withstand pressure variations of at least one atmosphere.

The laser beam going through this window placed upstream from the microscope lens has a diameter which is relatively large, being substantially equal to the inlet diameter of the microscope lens. This window can therefore be relatively thick without drawback.

The reaction chamber may be carried by drive means for displacing it relative to three perpendicular axes, with said drive means being likewise housed inside said enclosure.

The bottom of the enclosure includes through passages in which ducts are mounted in sealed manner leading to the means for reducing and regulating pressure and to a source of reactive gas, as are cables or wires for feeding and controlling the means for displacing the reaction chamber.

In order to provide access to the reaction chamber and enable the machine to be maintained, the enclosure includes a removeable wall, e.g. its top horizontal wall on which the microscope lens is fixed, or on which a microscope lens turret is fixed. Pneumatic actuators are associated with this moveable wall in order to assist in lifting it and in returning it to the operating position.

In addition, as well as including a path for transmitting the laser beam, the machine includes a path for illumination purposes and a path for observation purposes both of which lead to the microscope lens, with the observation path including optical filters, a video camera, and a video screen enabling the action of the laser microbeam on the thin film objects to be observed continuously.

BRIEF DESCRIPTION OF THE DRAWINGS

An embodiment of the invention is described by way of example with reference to the accompanying drawings, in which:

FIG. 1 is a diagrammatic vertical section view illustrating the essential characteristics of a machine of the invention;

FIG. 2 is a diagrammatic partially-cutaway perspective view of a preferred embodiment of a portion of a machine of the invention; and FIG. 3 is a perspective view of this portion of the machine, shown in a different position.

DETAILED DESCRIPTION

Reference is made initially to FIG. 1 which is a diagram of the essential component means of a machine of the invention.

This machine comprises a sealed enclosure 10 capable of withstanding pressure variations of at least one atmosphere, and made, for example, of aluminum.

This enclosure comprises a bottom 12, a vertical wall 14 which has a circular cylindrical section, for example, and a moving lid 16 mounted, for example, to pivot about a transverse horizontal axis and displaceable about said axis by means of pneumatic actuators 18.

A reaction chamber 20 is located inside the enclosure 10, this chamber being constituted by a sealed box of relatively small volume, comprising a moving lid 22 constituting a window and mounted in sealed manner, e.g. by screws, on the top edge of the reaction chamber 20. Inside the reaction chamber there is a horizontal table 24 which is guided in vertical displacement on columns 26 and which is urged towards the lid 22 by springs 28. A thickness wedge 30 is interposed between the table 24 and the lid 22 for adjusting the distance therebetween, and for positioning a thin film object 32 mounted on the table 24.

A microscope objective lens 34 or preferably a lens carrying turret, is fixed to the lid 16 and extends vertically inside the enclosure 10 so as to point perpendicularly to the plane of the thin film object 32. The microscope lens 34 receives a laser beam 36 via a window 38 mounted in sealed manner a through orifice in the lid 16.

The laser beam 36 is emitted by a laser source 40 such as a continuous argon laser, for example, and is transmitted by an optical system 42 which is generally of the same type as that described in above-mentioned French patent No. 2 608 484.

A light source 44 associated with an optical transmission system 46 and a video camera 48, e.g. of the type having CCD cells and associated with a system 50 of optical filters and with a video screen 52 respectively constitute an illumination path and an observation path which are combined with the laser beam transmission path prior to entering the microscope lens, i.e. slightly upstream from the window 38.

The laser beam going through the window 38 is of substantially the same diameter as the inlet diameter of the microscope lens, e.g. 5 mm to 6 mm. The window 38 is made of a material which is transparent to the laser radiation and which is of adequate thickness, e.g. about one centimeter, in order to withstand pressure variations of about one atmosphere. Given the diameter of the laser beam 36 and the radiated power, the passage through the window 38 does not degrade the optical qualities of the transmitted radiation.

The laser microbeam 54 leaving the microscope lens passes through the window 22 of the reaction chamber 20. This window is constituted by a thin plate 56 of material transparent to the laser radiation, it extends over an area substantially equal to the useful area of the thin film object 32, e.g. an electronic circuit, and it is thin, being about one millimeter thick for properly transmitting the laser microbeam 54 whose diameter lies, for example, in the range 0.1 $\mu$m and 10 $\mu$m. The thinness of the transparent plate 56, lying in the range 0.5 mm to 2 mm, for example, makes it possible to obtain the appropriate distance between the thin film object and the microscope lens as a function of the particular objective lens 34 used, which distance may lie in the range 3 mm to 20 mm.

The reaction chamber 20 is carried by means 58, 60, 62, and 64 enabling it to be displaced along three perpendicular axes, and also enabling it to be rotated about a vertical axis so as to enable the object 32 to be oriented angularly relative to one of the horizontal displacement axes of the reaction chamber 20. The means 58, 60, 62, and 64 are connected to a control circuit 62 lying outside the enclosure 10 and also serving to feed electrical power to the motors of these displacement means.

The reaction chamber 20 is connected via flexible ducts 68 and 70 to suction means 72 and to means 74 for feeding it with an atmosphere of reactive gas, and the enclosure 10 is connected via ducts 76 and 78 to suction reducing means 80 and to pressure-regulating means 82 operating by inserting a neutral or a chemically inert gas in the enclosure 10, e.g. nitrogen.

The various cables and connection ducts mentioned above are mounted in sealed manner in holes going through the bottom 12 of the enclosure.

This machine operates as follows:

A thin film object 32 is positioned on the table 24 of the reaction chamber 20, and then the lid 22 is fixed in place, e.g. by means of screws going through an annular metal ring fixed to the transparent plate 56. The wedge 30 serves to keep the object 32 in place on the table 24 and to adjust the distance between said table and the transparent plate 56 depending on the objective lens used so that the distance between the transparent plate 56 and the object 32 is as large as possible in order to avoid heating the plate 56, or to reduce the heating to which it is subjected, and thereby reduce the risk of depositing material on said plate.

The enclosure 10 is then reclosed by putting its lid 16 into place by means of the pneumatic actuators 18. These actuators also serve to hold the lid 16 in place by pressing with a certain amount of force in order to ensure that the enclosure 10 is sealed.

A vacuum is then progressively established simultaneously inside the enclosure 10 and inside the reaction chamber 20 by the suction means 72 and 80. Once a sufficiently low pressure has been achieved, e.g. about 0.1 mb (10 Pa), the desired reactive gas is inserted into the reaction chamber 20 at the desired pressure, which pressure lies between 1 mb and 100 mb, and may be about 10 mb, for example.

The reactive gas may be silane when it is desired to deposit silicon on a particular zone of the object 32, or else it may be chlorine if it is desired to etch a thin film of aluminum or of silica on the object 32.

Simultaneously, the pressure is regulated inside the chamber 10 by inserting an inert gas such as nitrogen so as to maintain a pressure which is slightly higher than the pressure in the reaction chamber 20. This avoids any risk of reactive gas leaking out from the reaction chamber 20.

To do this, a pressure sensor is provided, preferably inside the enclosure 10, in order to measure the pressure difference between the reaction chamber and the enclosure, and in order to control analog valves appropriately by means of a suitable circuit, said valves being mounted in the vacuum ducts and in the duct for conveying inert gas into the enclosure. In this way, the pressure inside the reaction chamber and inside the enclosure can be varied rapidly without running the risk of bursting the transparent lid on the reaction chamber.

The means 58 and 60 enable the reaction chamber to be displaced along two perpendicular horizontal axes, the means 62 enable it to be displaced up and down along a vertical axis, and the means 64 serve to define its angular direction relative to one of the horizontal displacement axes. The control circuit 66 may be actuated by an operator, or it may itself be under the control of data processing equipment.

The laser beam emitted by the source 40 and transmitted by the system 42 passes through the thick window 38 of the lid 16 and is focused by the lens 34 so as to form a small diameter laser microbeam 54 having a diameter lying in the range 0.1 pm to 10 $\mu$m, for example, and having its point of impact on the surface to be treated.

The illumination path 44 and 46 and the observation path 50, 48, and 52 enable the action of the laser microbeam on the surface to be treated to be observed continuously on the screen 52.

The etching and/or deposition operation may be controlled by an operator, or by a data processing system.

In a variant, the transparent lid 22 of the reaction chamber is constituted by the thin film object 32 when this object is itself constituted by a plane plate which is transparent to the laser radiation and when only one face thereof includes a thin film that absorbs the laser radiation (as applies, for example, to liquid crystal flat screens and to photolithographic masks). The object 32 is then mounted in sealed manner on the reaction chamber 20 with its thin film face pointing into the reaction chamber so that the thin film comes into contact with the reactive gas.

The laser beam then acts on the thin film through the transparent plate of the object for the purposes of etching, deposition, or cutting up.

Reference is now made to FIGS. 2 and 3 which show the essential portions of a preferred embodiment of a machine of the invention.

These figures show the lid 16 of the enclosure 10 which lid is fixed to a cylindrical skirt 84 that engages over the cylindrical side wall 14 of the enclosure 10. A lens-carrying turret 34 is fixed beneath the lid 16 facing the window 38. The lens-carrying turret is preferably motorized and is fitted with objective lenses all having the same length so as to enable lenses to be changed quickly without changing the other settings of the machine. The reaction chamber 20 is cylindrical in shape. The displacement means 58, 60, 62, and 64 are of the electrical micromotor type.

The junction between the cylindrical wall 14 of the enclosure and the skirt 84 of the lid 16 lies substantially at the same level as the lid of the reaction chamber 20, thereby providing easy access to the object placed inside the reaction chamber. The cylindrical wall 14 is itself removeable in order to facilitate maintaining the machine. The sealing gaskets provided between the various portions of the machine may be constituted by sealing rings sold under the name "Viton", for example, which rings are made of a material which is more or less chemically inert.

As can be seen in FIG. 3, the lid 16 may be fixed on a slab 86 on which a portion of the optical systems for the laser beam transmission path, the illumination path, and the observation path may be mounted.

The invention is essentially applicable to electronic circuits, hybrid circuits, flat display screens, magnetic read heads, etc. . . .

We claim:

1. A laser microbeam machine for acting on thin film objects, in particular for chemically etching or depositing material in the presence of a reactive gas, the machine including a laser source, a microscope objective lens pointing towards the thin film object, and optical means for transmitting the laser beam from the source to the microscope lens, the machine comprising:
   a reaction chamber formed essentially by a sealed box closed by a thin transparent lid and intended to receive the thin film objects and the reactive gas;
   a sealed enclosure in which the reaction chamber and the microscope lens are housed, with the lens being carried by one of the walls of said enclosure;
   suction means for reducing pressure simultaneously both in the reaction chamber and in the enclosure; and
   means for inserting a reactive gas at low pressure into the reaction chamber.

2. A machine according to claim 1, wherein when the thin film object is constituted by a transparent plate having only one face carrying a thin film, the object constitutes the transparent lid of the reaction chamber with its thin film face pointing towards the inside of the reaction chamber in order to come into contact with the reactive gas.

3. A machine according to claim 1, including means for regulating the pressure inside the enclosure to a value which is substantially equal to or slightly greater than the pressure of the reactive gas inside the reaction chamber, said means operating by inserting an inert gas such as nitrogen into the enclosure.

4. A machine according to claim 1, wherein the wall of the enclosure on which the microscope lens is fixed includes a window which is transparent to the laser radiation in order to transmit said radiation to the microscope lens, the window being of sufficient thickness to withstand pressure variations of at least one atmosphere.

5. A machine according to claim 1, wherein the reaction chamber is carried by drive means for displacing it relative to three perpendicular axes, with said drive means being likewise housed inside said enclosure.

6. A machine according to claim 1, wherein the reaction chamber includes a table for supporting the thin film objects, with means urging said table towards the transparent lid, and means constituting a thickness wedge for adjusting the thickness between the table and the transparent lid and for holding the object in position on the table.

7. A machine according to claim 1, wherein the bottom of the enclosure includes through passages receiving in sealed manner ducts connected to suction means, pressure-regulating means, and a source of reactive gas, and also receiving in sealed manner cables or wires for feeding and controlling means for displacing the reaction chamber.

8. A machine according to claim 1, wherein the enclosure includes a removeable wall giving access to the reaction chamber.

9. A machine according to claim 8, wherein the removeable wall of the enclosure is constituted by its lid which is mounted, for example, to pivot about a transverse axis and which is associated with operating actuators.

10. A machine according to claim 8, wherein the microscope lens or a lens-carrying turret is fixed to the removeable wall of the enclosure.

11. A machine according to claim 1, wherein in addition to a path for transmitting the laser beam, it includes an illumination path and an observation path both terminating at the microscope lens, with the observation path including optical filters, a video camera, and a video screen enabling the action of the laser microbeam on the thin film object to be observed continuously.

* * * * *